(12) United States Patent
Van Praet et al.

(10) Patent No.: US 9,124,251 B2
(45) Date of Patent: Sep. 1, 2015

(54) TWO STAGE SOURCE-FOLLOWER BASED FILTER

(71) Applicants: IMEC VZW, Leuven (BE); Universiteit Gent, Ghent (BE)

(72) Inventors: Christophe Van Praet, Ghent (BE); Guy Torfs, Ghent (BE); Johan Bauwelinck, Temse (BE); Jan Vandewege, Mariakerke-Gent (BE)

(73) Assignees: IMEC VZW, Leuven (BE); Universiteit Gent, Ghent (BE)

( * ) Notice: Subject to any disclaimer, the term of this patent is extended or adjusted under 35 U.S.C. 154(b) by 0 days.

(21) Appl. No.: 14/192,551

(22) Filed: Feb. 27, 2014

(65) Prior Publication Data

US 2014/0247089 A1  Sep. 4, 2014

(30) Foreign Application Priority Data

Mar. 1, 2013  (EP) .................................... 13157467

(51) Int. Cl.
  *H03H 11/12* (2006.01)
  *H03K 3/012* (2006.01)
  *H03H 11/04* (2006.01)
  *H03F 3/45* (2006.01)
  *H03F 3/50* (2006.01)

(52) U.S. Cl.
  CPC ............ *H03K 3/012* (2013.01); *H03F 3/45179* (2013.01); *H03F 3/505* (2013.01); *H03H 11/0405* (2013.01); *H03H 11/12* (2013.01); *H03H 11/1213* (2013.01)

(58) Field of Classification Search
  CPC ... H03K 3/012; H03H 11/0405; H03H 11/12; H03H 11/1213; H03F 3/50

USPC .......................... 327/552, 553, 555, 556, 557
See application file for complete search history.

(56) References Cited

U.S. PATENT DOCUMENTS

2006/0214726 A1 * 9/2006 Oishi ............................ 327/552

FOREIGN PATENT DOCUMENTS

| EP | 0 086 026 A2 | 8/1983 |
| EP | 2 429 075 A1 | 3/2012 |
| GB | 1 212 671 | 11/1970 |
| WO | 2007/034222 A2 | 3/2007 |

OTHER PUBLICATIONS

European Search Report, European Patent Application No. 13157467.5, dated Sep. 24, 2013.

Phang, K. et al., "A 3-V CMOS Optical Preamplifier With DC Photocurrent Rejection", Proceedings of the 1998 IEEE International Symposium on Circuits and Systems, 1998, ISCAS 1998, vol. 1, May 31-Jun. 3, 1998, pp. 305-308.

(Continued)

*Primary Examiner* — Jung Kim

(74) *Attorney, Agent, or Firm* — McDonnell Boehnen Hulbert & Berghoff LLP

(57) ABSTRACT

A filter, comprising: two source-follower stages connected in series and in between input nodes and output nodes, wherein inner nodes connect the two stages; and a frequency dependent feedback circuit connected between the input and output nodes, wherein the filter comprises additional frequency dependent feedback circuits connected between input nodes and inner nodes and between output nodes and inner nodes, the additional frequency dependent feedback circuits comprising capacitors.

16 Claims, 3 Drawing Sheets

(56) References Cited

OTHER PUBLICATIONS

Wyatt, Michael A., "Active Filter Gets Higher Frequencies", Electronic Design, vol. 39, No. 16, Aug. 22, 1991, one page.
Bezzam, Ignatius et al., "FA 17.6: A Fully-Integrated Continuous-Time Programmable CCIR 601 Video Filter", 1995 IEEE International Solid-State Circuits Conference, ISSCC95/Session 17/Video Signal Processing/Paper FA 17.6, pp. 296-297 and 383.
Manetti, S. et al., "A Fully Programmable Structure for Continuous-Time MOS Filters", Proceedings of 6th Mediterranean Electrotechnical Conference, vol. 1, May 22-24, 1991, pp. 355-358.
D'Amico, Stefano et al., "A 4.1-mW 10-MHz Fourth-Order Source-Follower-Based Continuous-Time Filter With 79-dB DR", IEEE Journal of Solid-State Circuits, Vo. 41, No. 12, Dec. 2006, pp. 2713-2719.
Torfs, Guy et al., "A Novel Large Input Range Source-Follower Based Filter Architecture", IEICE Electronics Express, vol. 8, No. 24, Dec. 25, 2011, pp. 2025-2028.
Chen, Yong et al., "Source-Follower-Based Bi-quad Cell for Continuous-Time Zero-Pole Type Filters", Proceedings of 2010 IEEE International Symposium on Circuits and Systems (ISCAS), May 30-Jun. 2, 2010, pp. 3629-3632.

* cited by examiner

TWO STAGE SOURCE-FOLLOWER BASED FILTER

CROSS-REFERENCE TO RELATED APPLICATIONS

This application claims priority to European Application No. 13157467.5 filed on Mar. 1, 2013, the contents of which are hereby incorporated by reference in their entirety.

FIELD

The present disclosure relates to the field of filters for electronic communication systems, including portable battery-powered receivers, like mobile phones and other terminals for wireless communication.

BACKGROUND

The use of filters in communication systems can be essential as they remove unwanted frequency components from a signal. Their selectivity (which is a measure of how well unwanted frequency components are suppressed) and linearity (which is a measure of the amount of frequency components introduced by the filter itself) strongly influence the design requirements for subsequent blocks in the systems, and affect both the performance and power consumption of the communication device. Designing filters using small, cheap active components, instead of bulky inductors, allows for monolithic integration. Because of their active nature, those filters, however, consume energy, have limited linearity, and generate noise.

Source-follower based filters as illustrated in FIG. 1 and discussed further in the detailed description have been proposed in the art. Because of their inherent feedback mechanism, the source follower based filters consume less power. However, because the poles and zeroes in the transfer function of the filter cannot be placed independently from each other, designing a filter with good selectivity may require cascading numerous filter stages. This limits the filter linearity and noise performance, and increases its power consumption. In other words, filter design can be challenging due to the observed trade-off between power consumption, on the one hand, and linearity and noise, on the other hand.

The problem that the applicant tries to solve, and which is at the origin of the instant disclosure, is to provide a filter with good linearity, good selectivity, and low power consumption which are suitable for monolithic integration.

SUMMARY

According to an aspect of the present disclosure, a source-follower based filter is disclosed, comprising: two source-follower stages, a first stage and a second stage, connected in series and in between input nodes and output nodes, wherein inner nodes connect the two stages; and a frequency dependent feedback circuit connected between said input and output nodes, wherein the filter comprises additional frequency dependent feedback circuits connected between input nodes and inner nodes, and between output nodes and inner nodes, the additional frequency dependent feedback circuits comprising capacitors.

Because of the additional frequency dependent feedback circuits, it is possible to define a filter having a transfer function with at least two poles and at least two zeroes with each of the poles and each of the zeroes defined independently from one another. This allows designing a filter with better selectivity, better linearity, and better noise performance without increasing power consumption, as a better filter can be obtained using fewer stages. As a result, the trade-off between power consumption and filter performance is relaxed.

According to some embodiments, the output nodes and the inner nodes of the filter are each connected to a capacitor. These capacitors influence the location of the complex poles in the transfer function.

According some embodiments, one or more of the capacitors are implemented as variable capacitors or as configurable banks of capacitors.

According to some embodiments, each of said two source-follower stages comprises an amplification stage which may consist of a single transistor in a source-follower configuration. Further, the source-follower transistors of the two stages are connected in cascade, with additional feedback of the current of the second stage into the first stage, which allows generating of complex poles in the transfer function.

According to some embodiments the filter is a differential filter. In other words, there are two sets of first stages, one for a positive input signal and one for a negative input signal, the difference between the positive and negative input signal being the differential input signal. There are also two sets of second stages. One second stage is connected to the first stage with the positive input signal, giving a positive output signal and one second stage is connected to the other first stage with the negative input signal, giving a negative output signal. The difference between the positive and negative output signal is the differential output signal. In the differential filter there are thus two input nodes, two inner nodes and two output nodes.

It is a further advantage of the differential filter that the input and output signals are less susceptible to noise originating from the power supply or reference voltage of the filter.

According to some embodiments, the output nodes and the inner nodes of the differential filter are each connected by a capacitor. These capacitors influence the location of the complex poles in the transfer function.

According to some embodiments, each one of the stages comprises a current source. Further, the current source of the first stage is implemented as a current mirror, which mirrors the current from the second stage. This leads to improved filter linearity.

According to some embodiments, the additional frequency dependent feedback circuits comprise only capacitors.

According to some embodiments, the additional frequency dependent feedback circuits do not comprise resistors.

According to some embodiments, the source-follower based filter comprises of only two source-follower stages. Because both the poles and zeroes of the filter transfer function are complex, any type of filter, e.g. a low-pass, a band-pass or a notch filter, can be realized with only two source-follower stages.

According to some embodiments, the source-follower based filter comprises only capacitors and no resistors. This allows for monolithic integration of the filter.

According to some embodiments, a source-follower based filter is disclosed, comprising: two source-follower stages, a first stage and a second stage, connected in series and in between input nodes and output nodes, wherein inner nodes connect the two stages, and a frequency dependent feedback means connected between said input and output nodes, the filter having a transfer function with at least two zeroes and at least two poles, wherein said filter comprises additional frequency dependent feedback means for defining each of said poles and each of said zeroes independently of one another.

According to some embodiments, the at least two poles are complex poles, and the at least two zeroes are complex zeroes. This allows defining each of the poles and each of the zeroes independently from one another.

BRIEF DESCRIPTION OF THE FIGURES

The disclosure will be further elucidated by means of the following description and the appended figures.

DETAILED DESCRIPTION

Figure 1:
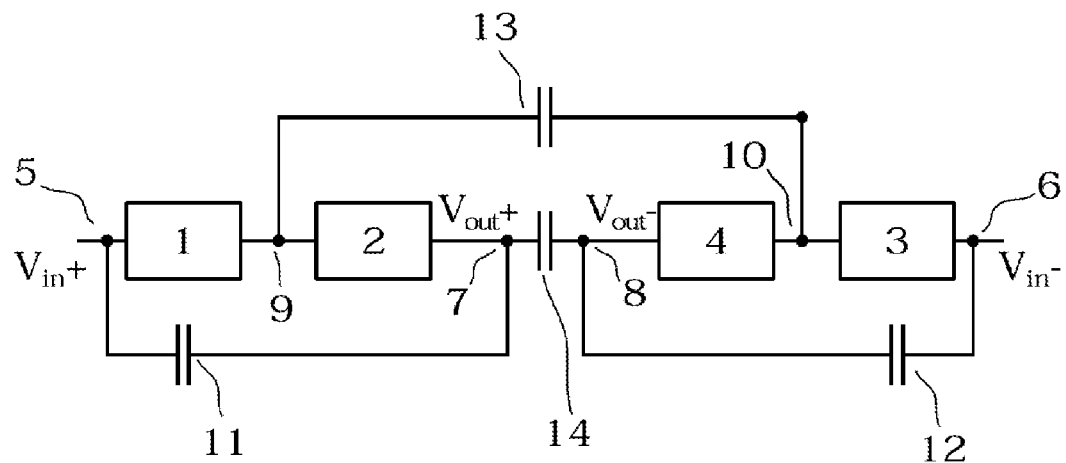
FIG. 1 shows a schematic view of a two stage source follower based filter of the prior art.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

A filter is a system with an input and an output (each consisting of a single node in a single-ended configuration, and respectively two nodes in a differential configuration) which is characterized by its transfer function TF which characterizes the filter frequency response by defining a relation between the frequency spectrum of the output signal So and the frequency spectrum of the input signal Si as follows:

$$S_o = TF * S_i$$

A transfer function is expressed by a ratio N/D, N being the numerator which defines the "zero" frequencies of the filter and D, the denominator defining its "pole" frequencies. These poles and zeroes allow derivation of the so called Bode plot of the filter system which serves as an intuitive representation of the frequency response of the filter by showing the relation between the input and the output of the filter as a function of the frequency. Each pole or zero changes the magnitude of the slope of the frequency response of the filter at the frequency it is located with −20dB or +20dB per decade, respectively, i.e. decrease or increase the magnitude of the filter response.

Clearly, more poles allow for higher attenuation and thus, better selectivity. Thus, to increase the selectivity of a conventional single-stage filter, which typically only offers one pole, additional poles can be added by cascading several single-stage filters having poles located as close to each other as possible. However, adding additional filter stages can be detrimental to the filter linearity, as the closely placed poles interact with each other producing ringing artefacts; a brief decrease in attenuation at the transition frequency is observed followed by the desired increase in attenuation. Zeroes can compensate for this ringing and benefit a sharp transition, and hence improve selectivity, at the cost of decreased attenuation at distant frequencies. In addition, cascading several stages may increase the power consumption and the noise figure.

It will be appreciated by the skilled person that the filter according to aspects of the present disclosure provides good selectivity, comprising a frequency response showing a sharp transition around the frequency components of interest by using a minimum number of filter stages to reduce added noise and power consumption.

A schematic view of a conventional source-follower based filter implemented in a differential configuration is shown in FIG. 1. The filter consists of two stages 1,3; 2,4 connected between its input 5,6 and output 7,8. The filter is in a differential configuration and therefore has another set of stages 3,4. Therefore, the filter includes two pairs of two source-followers stages 1,2 and 3,4 between input nodes 5,6 and output nodes 7,8 (respectively plus and minus as it is a differential configuration), inner nodes (9,10) being defined between the two stages of each pair 1,2; 3,4. Two feedback capacitors 11,12—here of the same value—are connected in parallel with each pair of stages 1,2 and 3,4, between input and output nodes 5,7 and 6,8 respectively. Two additional capacitors 13,14 are connected between the two inner nodes 9,10 (parallel capacitor 13) and output nodes 7,8 (series capacitor 14), respectively. These capacitors in combination with the transconductance of the source-followers, determine the location of the complex poles and imaginary zeroes in the transfer function.

This filter has two zeroes and two poles in its transfer function. However, these four parameters are linked to each other, in a way that, when three of them have been selected, the fourth one is determined. This is because this conventional filter has only complex conjugate imaginary zeroes, which by nature are interlinked. Thus, the filter of FIG. 1 does not offer a sufficient degree of freedom to freely place each zero on the complex plane and hence does not allow freely determining the shape of the filter's transfer function.

Figure 2:
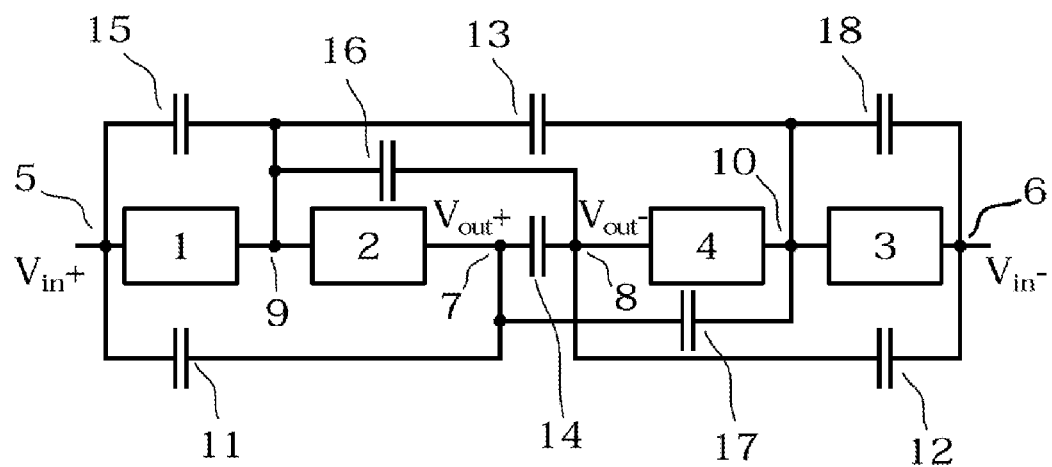
FIG. 2 shows an example schematic view of a two stage source follower based filter according to aspects of the disclosure for comparison with the prior art.

FIG. 2 shows an example schematic view of the filter according to the present disclosure. For sake of a better understanding of the comparison between the filter of FIG. 1 of the prior art and the filter of FIG. 2 of the disclosure, the similar components present in both filters are labelled with identical reference numbers. In addition to the components of FIG. 1, the filter of FIG. 2 comprises additional feedback means 15 and 16, one 15 between the input 5 and the inner node 9 and one 16 between the inner node 9 and the output node 8. As the schematic shows a differential configuration of the filter, similar feedback means 18 and 17 are comprised for the other two stages 3 and 4.

Figure 3:
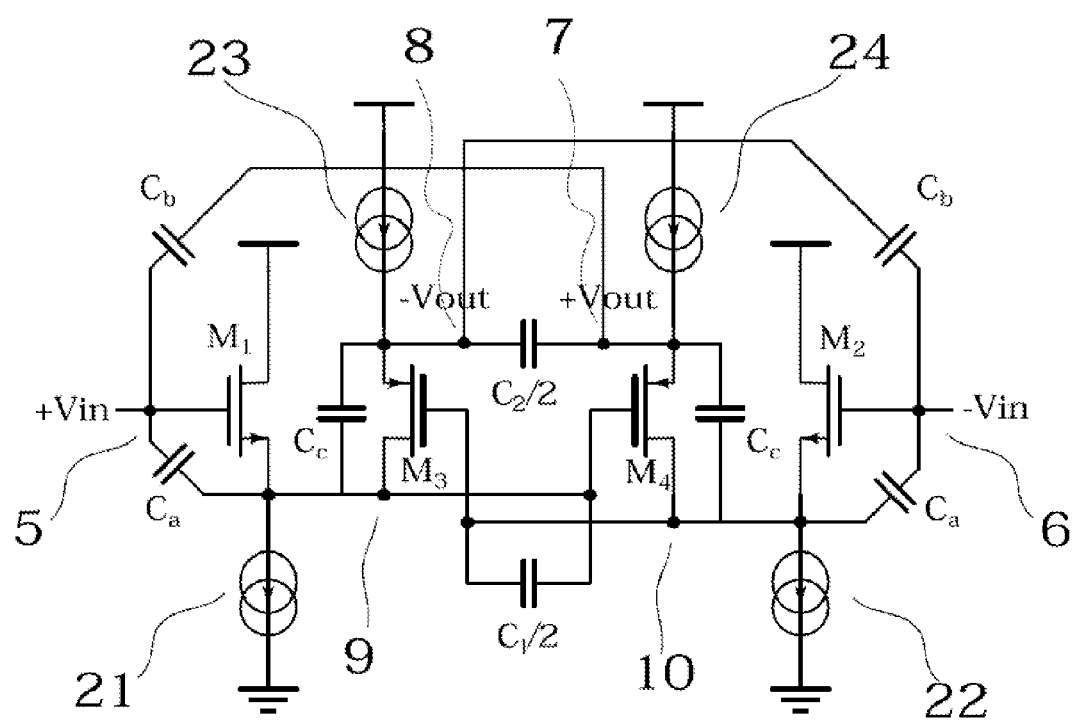
FIG. 3 shows an example circuit of an embodiment of the two stage source follower based filter according to aspects of the disclosure.

FIG. 3 shows a circuit according to an embodiment of the present disclosure and in line with the schematic view of FIG. 2. When comparing FIG. 2 and FIG. 3, the following correspondences can be noted:

Feedback means 11—Capacitor $C_b$
Feedback means 12—Capacitor $C_b$
Feedback means 13—Capacitor $C_1/2$
Feedback means 14—Capacitor $C_2/2$
Feedback means 15—Capacitor $C_a$
Feedback means 16—Capacitor $C_c$
Feedback means 17—Capacitor $C_c$
Feedback means 18—Capacitor $C_a$ As is clearly apparent, the filter of FIG. 3, which is here a differential filter, is distinguished from the one of FIG. 1 by the four additional feedback capacitors Ca and Cc 15-18. Two capacitors Ca 15,18 are connected between input node 5 and inner node 9 and between input node 6 and inner node 10. Two capacitors Cc 16,17 are connected between output node 8 and inner node 9 and between output node 7 and inner node 10.

The first stage of the filter connecting the input node 5 with the inner node 9 comprises a transistor M1 in a source follower configuration and a current source 21 which defines the operating point of the transistor. A second stage comprising a current source 24 and transistor M4 again in a source follower configuration connects the inner node 9 with the output node 7. As the filter is in a differential configuration there is a second pair of stages similar or identical to the first pair comprising transistors M2 and M3 and current sources 22 and 23.

The merit of the disclosure has been to include, within the filter, a rather important number of frequency dependent feedback means as for instance feedback paths and, particularly, as compared with the filter of the prior art, additional capacitors 15,18 between input and inner nodes and additional capacitors 16,17 between inner and output nodes. By the addition of these feedback means, the filter of FIG. 2 and FIG. 3 are filters with two complex zeroes and two complex poles. As the filter transfer function is defined by only complex poles and complex zeroes, and not by complex conjugate ones, each of the zeroes and each of the poles are independent from each other.

The transfer function TF of the filter shown in FIG. 2 and FIG. 3 is given below. The TF offers two complex zeroes and two complex poles—both the nominator and the denominator are of second order. The capacitors and the transistor transconductance gm define the location of the poles and zeroes.

$$TF = \frac{\frac{(-C_a + C_c)C_b + C_c(C_a + C_1)}{g_m^2}s^2 + \frac{C_a - C_b}{g_m}s + 1}{(C_a + C_c + C_1 + C_2)C_b + \frac{(C_c + C_2)(C_a + C_1)}{g_m^2}s^2 + \frac{C_b + C_a + C_1}{g_m}s + 1}$$

When equating the transfer function to a standard second order linear time-invariant system and by, for example, choosing a value for Ca, the below equations for C1, C2, Cb and Cc can be obtained. The value for Ca may be chosen arbitrarily, however, it should be a manufacturable value. Choosing a small value for Ca will increase the impact of the highly non-linear parasitic capacitances of the transistors. Based on Ca, the desired Qp and Qn (the quality factor of poles and zeroes, respectively) and wp and wn (resonance frequency of poles and zeroes, respectively), the other capacitor values can be determined.

$$C1 = \frac{g_m}{\omega_n Q_n} + \frac{g_m}{\omega_p Q_p} - 2C_a$$

$$C2 = \frac{\omega_p g_m Q_p}{\omega_n^2 Q_n^2} + \frac{g_m}{\omega_n Q_n} - \frac{\omega_p Q_p g_m}{\omega_n^2} + \frac{g_m Q_p}{\omega_p} - \frac{\omega_p C_a Q_p}{\omega_n Q_n} - C_a$$

$$C_b = C_a - \frac{g_m}{\omega_n Q_n}$$

$$C_a = \frac{\omega_p Q_p C_a^2}{g_m} - \frac{\omega_p C_a Q_p}{\omega_n Q_n} + \frac{\omega_p Q_p g_m}{\omega_p^2}$$

As the skilled person will recognize, the degree of freedom is sufficient to place each of these poles and each of these zeroes independently from one another and allows the shape of transfer function to be freely determined.

To improve feasibility, the cross coupling of the capacitors Ca, Cb and Cc may be changed. This will not influence the presented idea and will only cause minor changes to the expression of the transfer function, which, however, will yield different values for the capacitors for the same transfer function which could help to reduce the relative importance and hence the impact, of parasitic capacitances.

To allow for monolithic integration of the filter, the frequency dependent feedback means of the previous embodiments shown in FIG. 2 to FIG. 3 do not comprise any resistors but capacitors only.

To allow for adjustments of the filter characteristics, one or more of the capacitors, may be implemented as variable capacitors or as configurable banks of capacitors.

Figure 4:
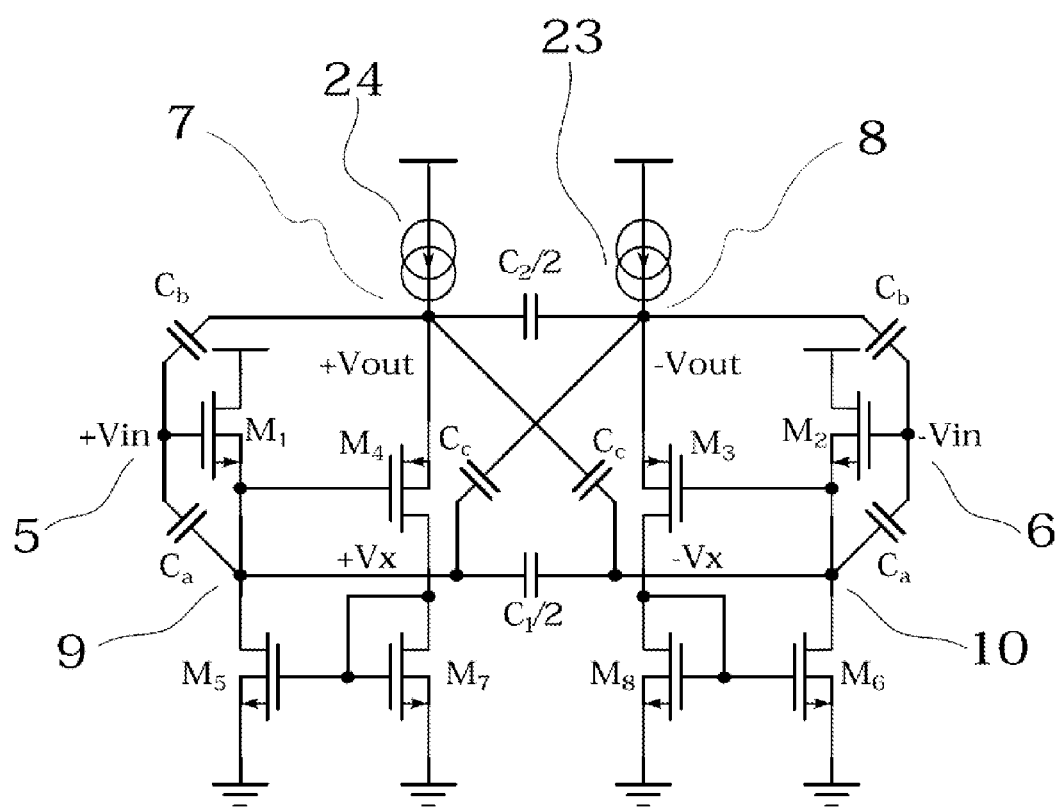
FIG. 4 shows an example circuit of a further embodiment of the two stage source follower based filter according to aspects of the disclosure.

An alternative embodiment for the current sources 21-24 of the previous embodiment is shown in FIG. 4. Instead of using a current source 21 for the first stage, a current mirror may be used. This current mirror preferably comprises two transistors M5, M7 whereby transistor M7 senses the current in the second stage and drives transistor M5 to deliver a current to the first stage equal to the one in the second stage. Dependent on the dimensions of the transistor M5 and M7 the ratio between the current in the first stage and the second stage may be chosen. Furthermore, the current mirror feeds back the current of the second stage, removing the need to directly connect the drain of the second stage to the source of the first stage. Since the drain of the second stage is now loaded by a node with low impedance, the linearity of the filter is improved.

What is claimed is:

1. A filter comprising:
   two source-follower stages connected in series and in-between an input node and an output node, wherein an inner node connects the two source-follower stages;
   a frequency dependent feedback circuit connected between the input node and the output node;
   a first additional frequency dependent feedback circuit connected between the input node and the inner node; and
   a second additional frequency dependent feedback circuit connected between the output node and the inner node,
   wherein the filter has a transfer function with at least two zeroes and at least two poles, and wherein the first additional frequency dependent feedback circuit and the second additional frequency dependent feedback circuit define each of the at least two poles and each of the at least two zeroes independently of one another.

2. The filter according to claim 1, wherein the at least two poles are complex poles, and wherein the at least two zeroes are complex zeroes.

3. The filter of claim 1, wherein each of the first additional frequency dependent feedback circuit and the second additional frequency dependent feedback circuit comprises at least one capacitor.

4. The filter according to claim 1, wherein each of the two source-follower stages comprises a source-follower transistor.

5. The filter according to claim 4, wherein the respective source-follower transistors of the two source-follower stages are connected in cascade.

6. The filter according to claim 1, wherein each one of the two source-follower stages comprises a current source.

7. The filter according to claim 6, wherein the current source of at least one source-follower stage of the two source-follower stages is implemented as a current mirror.

8. The filter according to claim 3, wherein one or more of the capacitors are implemented as variable capacitors or as configurable banks of capacitors.

9. The filter according to claim 1, wherein the first additional frequency dependent feedback circuit and the second additional frequency dependent feedback circuit comprise only capacitors.

10. The filter according to claim 1, wherein the first additional frequency dependent feedback circuit and the second additional frequency dependent circuit do not comprise resistors.

11. The filter according to claim 1, wherein the filter does not comprise any resistors.

12. A filter comprising:
a first pair of source-follower stages connected in series between a first input node and a first output node, wherein a first inner node connects the first pair of source-follower stages;
a second pair of source-follower stages connected in series between a second input node and a second output node, wherein a second inner node connects the second pair of source-follower stages;
a first frequency dependent feedback circuit connected between the first input node and the first output node;
a second frequency dependent feedback circuit connected between the second input node and the second output node;
a first additional frequency dependent feedback circuit connected between the first input node and the first inner node;
a second additional frequency dependent feedback circuit connected between the second input node and the second inner node;
a third additional frequency dependent feedback circuit connected between the first output node and the second inner node; and
a fourth additional frequency dependent feedback circuit connected between the second output node and the first inner node,
wherein each of the first, second, third, and fourth additional frequency dependent feedback circuits comprises at least one capacitor.

13. The filter of claim 12, further comprising:
a first capacitor connected between the first output node and the second output node; and
a second capacitor connected between the first inner node and the second inner node.

14. The filter of claim 12, wherein the filter is a differential filter.

15. The filter of claim 12, wherein the filter has a transfer function with at least two zeroes and at least two poles, and wherein the first, second, third, and fourth additional frequency dependent feedback circuits define each of the at least two poles and each of the at least two zeroes independently of one another.

16. The filter of claim 15, wherein the at least two poles are complex poles, and wherein the at least two zeroes are complex zeroes.

* * * * *